United States Patent [19]

Sakemi et al.

[11] Patent Number: 5,657,528
[45] Date of Patent: Aug. 19, 1997

[54] METHOD OF TRANSFERRING CONDUCTIVE BALLS

[75] Inventors: Shoji Sakemi; Tadahiko Sakai, both of Fukuoka, Japan

[73] Assignee: Matsushita Electric Industrial Co., Ltd., Osaka, Japan

[21] Appl. No.: 515,745

[22] Filed: Aug. 16, 1995

[30] Foreign Application Priority Data

Aug. 25, 1994 [JP] Japan .................................. 6-200636
Aug. 25, 1994 [JP] Japan .................................. 6-200637

[51] Int. Cl.$^6$ .............................. B23P 11/00; B23K 35/12
[52] U.S. Cl. .............................. 29/430; 29/743; 228/41; 228/245
[58] Field of Search ............................. 29/843, 430, 559, 29/743, DIG. 38; 228/41, 180.22, 245, 256; 414/156, 620, 627

[56] References Cited

U.S. PATENT DOCUMENTS 4,480,780  11/1984  Claeskens et al. ................ 29/743 X
4,871,110  10/1989  Fukasawa et al. ................. 228/245
5,445,313   8/1995  Boyd et al. ................... 228/180.22 X
5,467,913  11/1995  Namekawa et al. ................. 228/41

FOREIGN PATENT DOCUMENTS 5129374   5/1993  Japan ........................... 228/180.22
89002653  3/1989  WIPO ............................ 228/180.22

*Primary Examiner*—Peter Vo
*Assistant Examiner*—Khan Nguyen

[57] ABSTRACT

A suction head is introduced into a ball reservoir holding conductive balls, such as solder balls, and a plurality of suction holes formed in a suction surface of the suction head, hold the conductive balls by suction, respectively. Then, the suction head is moved into a position above a workpiece placed in position, and the suction is released from the conductive balls held on the suction head, thereby placing these conductive balls onto the workpiece. The suction head is vibrated or moved within the ball reservoir so that each of the suction holes can positively hold one conductive ball, thus preventing extra conductive balls from sticking to the suction head.

12 Claims, 5 Drawing Sheets

METHOD OF TRANSFERRING CONDUCTIVE BALLS

BACKGROUND OF THE INVENTION

This invention relates to an apparatus for and a method of transferring conductive balls onto a workpiece (e.g. a board or an electronic device such as a ball grid array).

Recently, there has been proposed a solder ball-transferring apparatus for transferring a plurality of solder balls at a time. FIG. 5 shows the operation of such a conventional solder ball-transferring apparatus.

In FIG. 5, reference numeral 1 denotes a ball reservoir for holding a number of solder balls 2 therein, and this ball reservoir 1 has an open top through which a suction head 3 is movable into and out of the ball reservoir 1. The suction head 3 has a plurality of suction holes 3a formed in its lower surface in a matrix pattern, so that the suction head 3 can pick up a plurality of solder balls 2 at a time by suction. Here, the suction head 3 is designed such that each suction hole 3a can hold one solder ball 2 by suction.

Actually, however, an extra solder ball $b$ other than one solder ball $a$ is often drawn to be held by the suction hole 3a under suction, or extra solder balls $c$ stick to the lower surface of the suction head 3, as shown in FIG. 5. As a result, these extra solder balls $b$ and $c$ are transferred onto a workpiece.

It is desired to increase the suction pressure so that the solder balls 2 will not drop during the movement of the suction head 3. However, if the suction pressure is increased in the conventional solder ball-transferring apparatus, the solder balls 2 are excessively held by the suction holes 3a under suction, and even when the suction condition is released so as to place the solder balls 2 onto the workpiece, the solder balls 2 often failed to drop from the suction head 3, so that the solder balls 2 could not be properly transferred onto the workpiece. Thus, the conventional solder ball-transferring apparatus has a problem that the pick-up of the solder balls from the solder ball reservoir, as well as the transfer of the solder balls onto the workpiece, can not be carried out in a highly reliable manner.

SUMMARY OF THE INVENTION

It is therefore an object of this invention to provide an apparatus for and a method of transferring solder balls in which an error in pick-up and transfer of the solder balls is eliminated, thereby surely transferring the solder balls onto a workpiece.

According to one aspect of the present invention, there is provided apparatus for transferring conductive balls comprising:

a positioning table for positioning a workpiece;

a ball reservoir for storing a number of conductive balls;

a suction head having a plurality of suction holes for respectively holding said conductive balls by suction;

moving means for moving said suction head between said ball reservoir and said workpiece;

vertically-moving means for moving said suction head upward and downward; and means for imparting vibrations to said conductive balls held by suction on said suction head.

According to another aspect of the invention, there is provided a method of transferring conductive balls comprising the steps of:

moving a suction head downward into a ball reservoir so as to cause a plurality of suction holes in a lower surface of said suction head to respectively hold conductive balls in said ball reservoir by suction, and moving said suction head upward from said ball reservoir, thus picking up said conductive balls; and subsequently moving said suction head into a position above a workpiece, then moving said suction head downward toward said workpiece, and then releasing said suction holes from the suction, thereby transferring said conductive balls from said suction head onto said workpiece;

wherein when said suction head holds said conductive balls in said ball reservoir by suction, and is moving upward from said ball reservoir so as to pick up said conductive balls, vibrations are imparted to said suction head.

With this construction, when the suction head, holding the conductive balls (solder balls) by suction, is moving upward from the ball reservoir, the vibration-imparting means is operated. Here, extra conductive balls, held by suction on the suction head in the vicinity of those conductive balls directly held respectively by the suction holes under suction, as well as extra conductive balls sticking to the lower surface of the suction head by suction, are liable to drop from the suction head since the suction forces holding these extra conductive balls are weak. Therefore, only those conductive balls directly held respectively by the suction holes under suction are picked up, and the extra conductive balls drop into the ball reservoir from the suction head, thus preventing a pick-up error.

When the conductive balls are to be transferred from the suction head to the workpiece, the vibration-imparting means is operated, so that all of the conductive balls firmly held directly by the respective suction holes under suction are forcibly caused to drop from the suction head, thus positively transferring the conductive balls onto the workpiece.

DESCRIPTION OF THE PREFERRED EMBODIMENT

Figure 1:
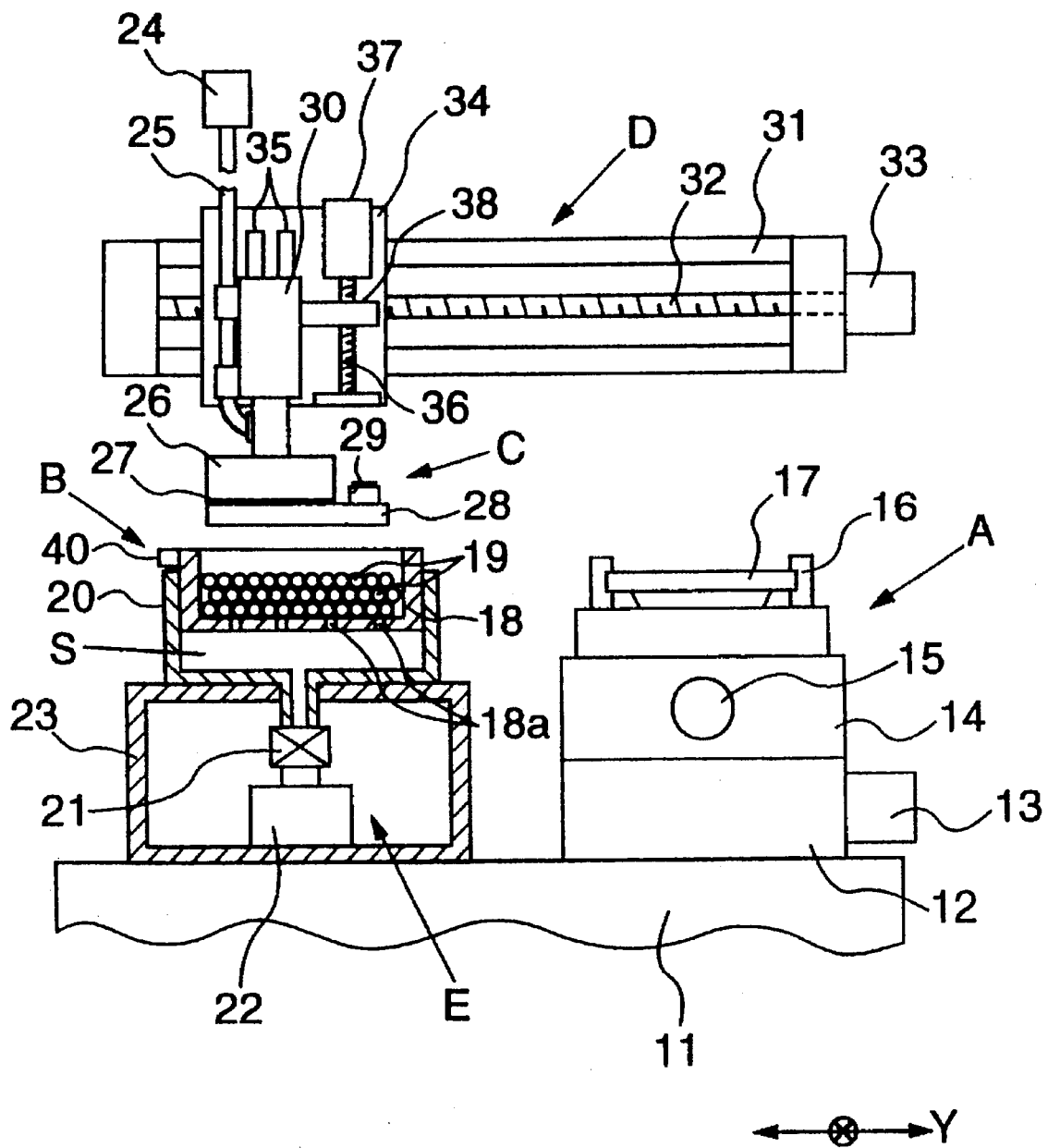
FIG. 1 is a front-elevational view of one preferred embodiment of a solder ball-transferring apparatus of the present invention.
Figure 2:
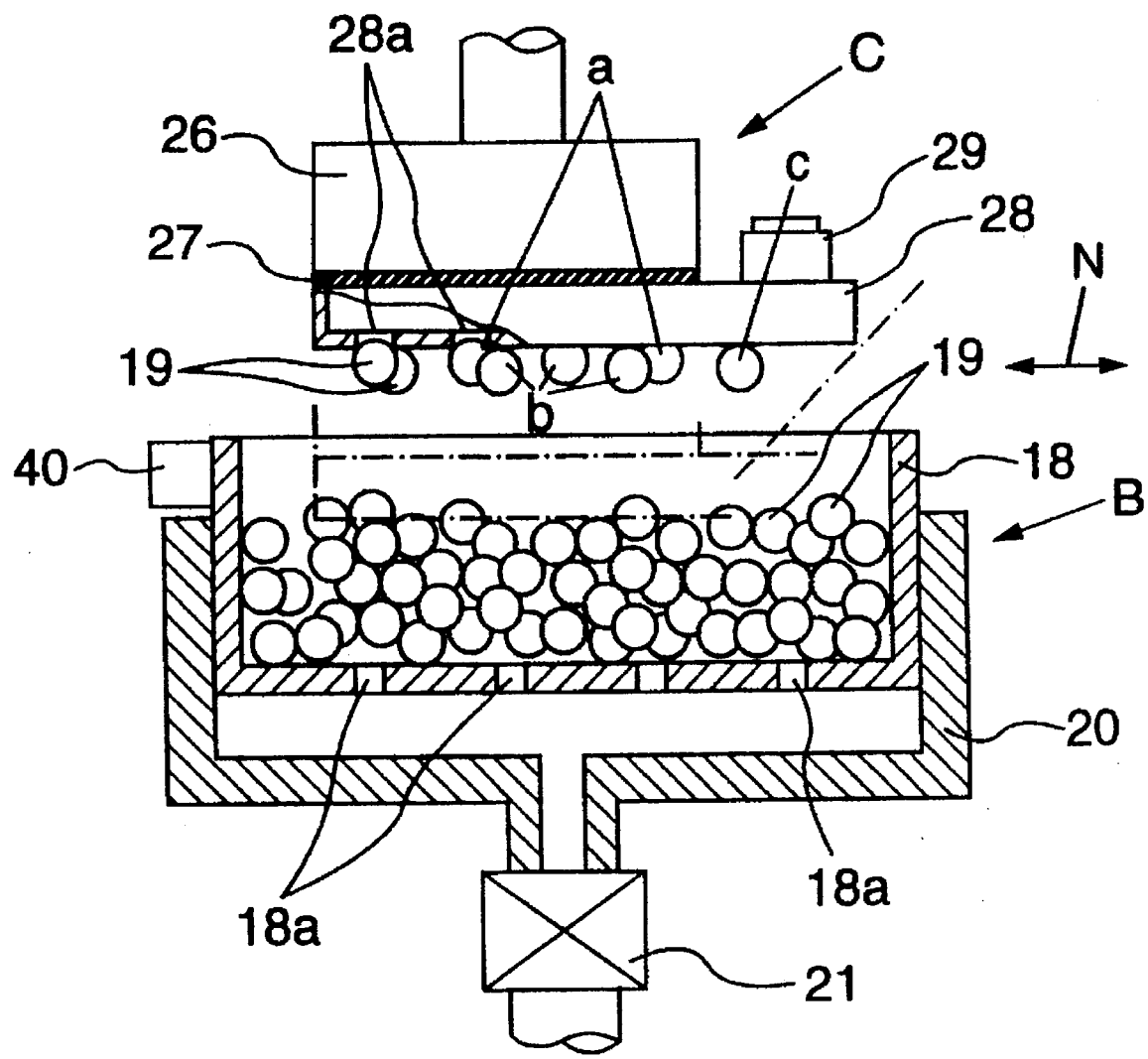
FIGS. 2 to 4 are views explanatory of the operation of the solder ball-transferring apparatus.
Figure 3:
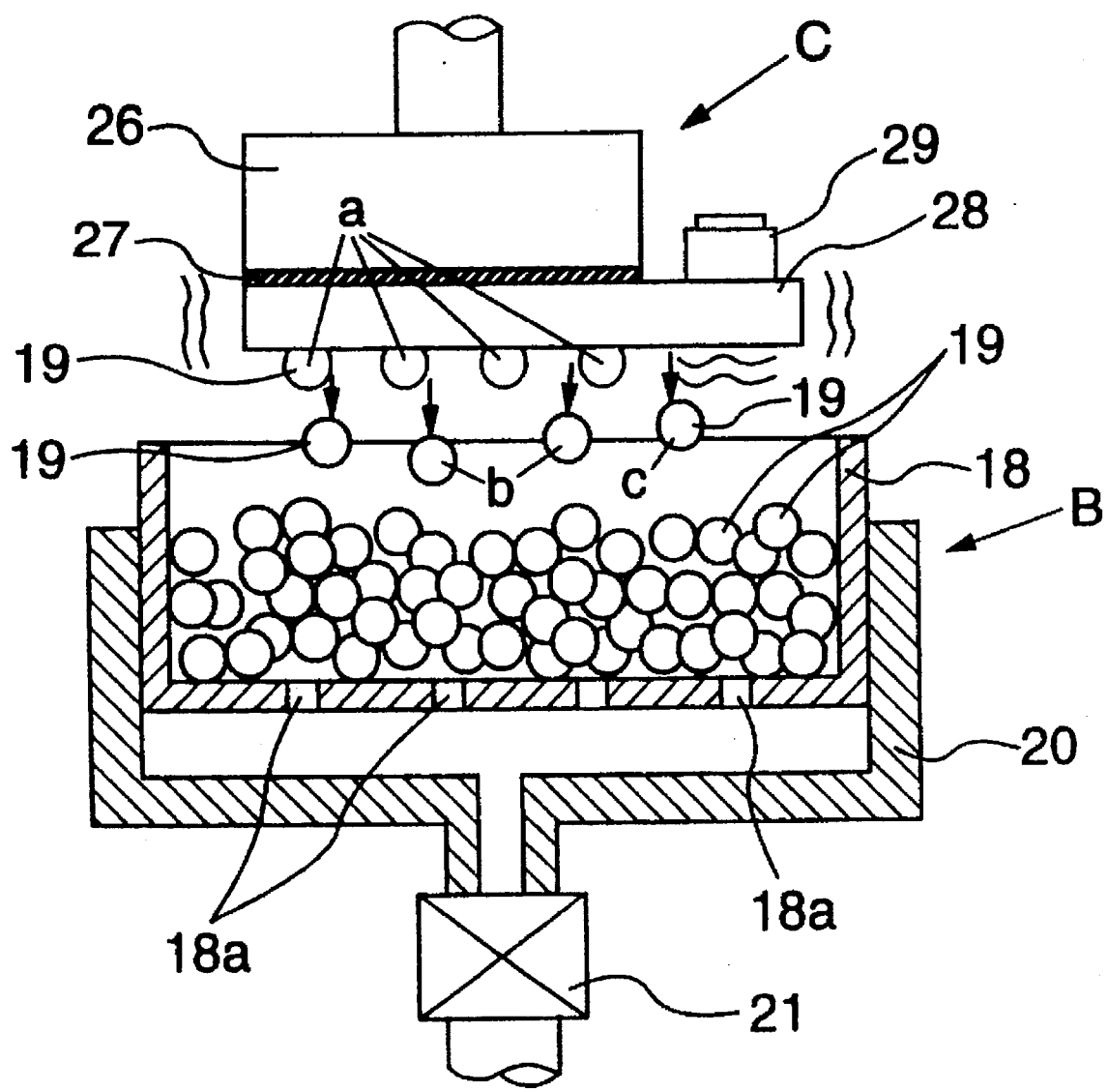
Figure 4:
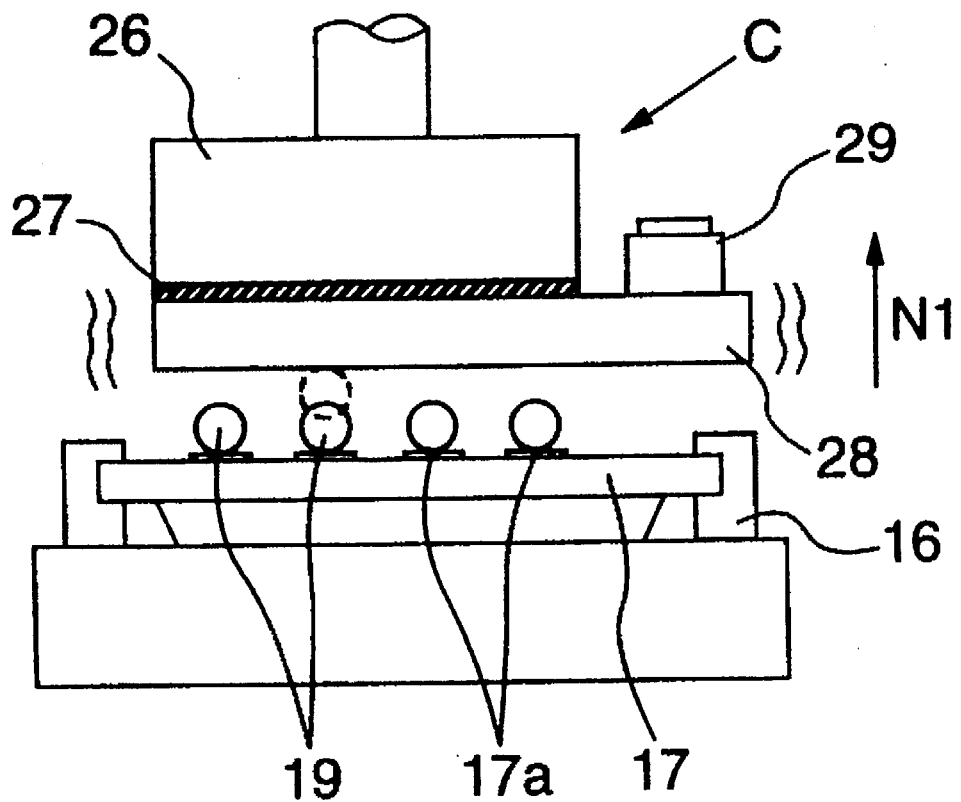
Figure 5:
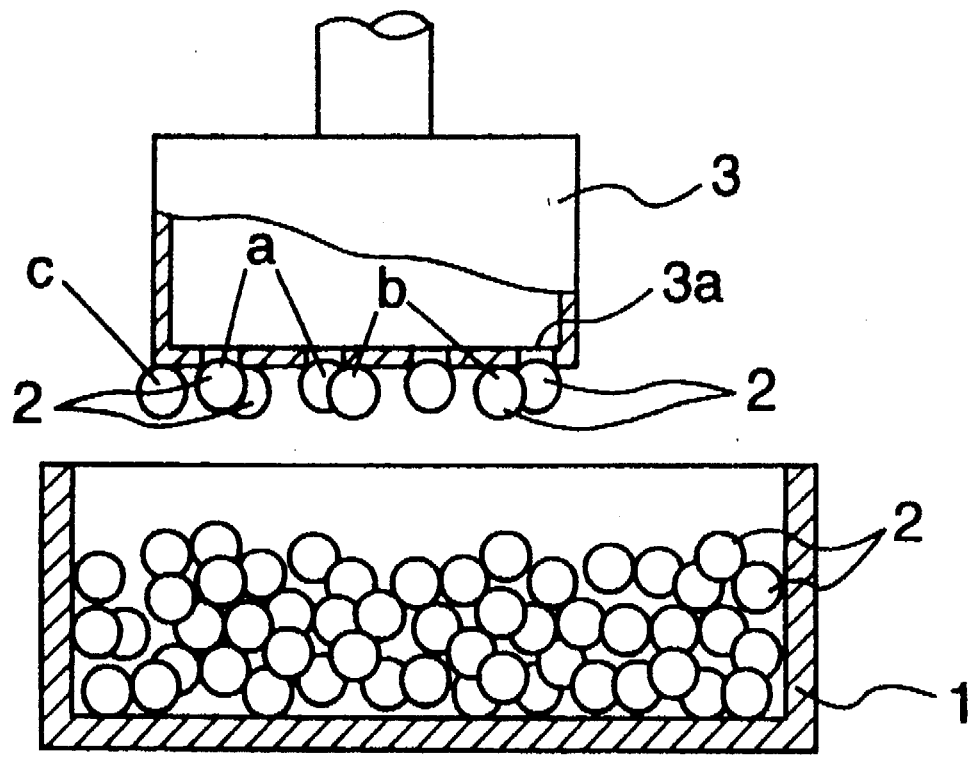
FIG. 5 is a view explanatory of the operation of a conventional solder ball-transferring apparatus.

One preferred embodiment of the present invention will now be described with reference to the drawings. FIG. 1 is a front-elevational view of one preferred embodiment of a solder ball-transferring apparatus of the invention, and FIGS. 2 to 4 are views explanatory of the operation of the solder ball-transferring apparatus.

In FIG. 1, a positioning table A is mounted on a base 11. This positioning table A comprises a Y-axis table 12 driven by a Y-axis motor 13, an X-axis table 14 driven by an X-axis motor 15, and a holder 16 mounted on the X-axis table 14 for holding a workpiece 17. By operating the X-axis motor 15 and the Y-axis motor 13, the workpiece 17 is placed in position. In this embodiment, the workpiece 17 is a board.

A ball reservoir B is mounted on the base 11 adjacent to the positioning table A. The ball reservoir B includes a ball casing 18 with an open top, which stores a plurality of solder balls 19 in layers. Vent holes 18a smaller in diameter than the solder ball 19 are formed through a bottom wall of the ball casing 18. An outer tube 20 receives therein the ball casing 18, and an internal space S in the outer tube 20 is in communication with the vent holes 18a. A gas supply means E is connected to a lower side of the internal space S. This gas supply means E comprises a blower 22 for supplying inert gas (e.g. $N_2$ gas) or dry air, and a valve 21 for opening and closing a flow passage through which the gas flows from the blower 22 to the internal space S.

The blower 22 is operated, and the valve 21 is opened, so that the gas flows upwardly through the internal space S, the vent holes 18a and the layers of solder balls 19. In this embodiment, there is provided the gas supply means E, and therefore by feeding the gas to the layers of solder balls 19, the solder balls 19 are brought into a floated and fluidized condition so that the solder balls 19 will not aggregate together. Namely, the solder balls 19 can be picked up separately and independently of one another, so that each suction hole 28a can hold one solder ball 19 easily. For floating and fluidizing the solder balls 19, there may be used a vibrator 40 which imparts vibrations to the solder balls 19.

A suction head C for transferring the solder balls 19 includes a head body 26 of a hollow construction connected to a suction device 24 via a pipe 25. A suction pad 28 is resiliently connected to the head body 26 through a vibration-isolating rubber member 27. A plurality of suction holes 28a are formed in a lower surface of the suction pad 28 in a matrix pattern corresponding to the arrangement and number of the solder balls 19 to be transferred to the workpiece 17 by the suction head C (see FIG. 2). A vibrator element 29 serving as vibration-imparting means is mounted on the suction pad 28, and the head body 26 is fixedly secured to a lower end of a support block 30. For example, a piezoelectric element which can produce ultrasonic waves can be used for the vibrator element 29. It is noted that ultrasonic vibration is very suitable for this purpose. With this construction, when each of the suction holes 28a holds one solder ball 19 by suction, and the vibrator element 29 is operated, then extra solder balls 19 other than those solder balls 19 held respectively by the suction holes 28a under suction are caused to drop. The vibration-isolating rubber member 27 prevents vibrations, produced by the vibrator element 29, from being transmitted to the head body 26, thus preventing the head body 26 from being vibrated.

A moving means D is provided for reciprocally moving the suction head C between the ball reservoir B and the workpiece 17. This moving means D includes a support frame 31 extending in a Y-axis direction, a feed screw 32 rotatably borne by the support frame 31, and a Y-axis motor 33 for rotating the feed screw 32. A moving plate 34 has a nut portion (not shown) provided on a reverse surface thereof, and is threadedly engaged with the feed screw 32. Vertical guide rails 35 are mounted on the moving plate 34, and the support block 30 is mounted on the vertical rails 35 for sliding movement therealong. A vertical feed screw 6 is rotatably borne by the moving plate 36, and is rotated by a Z-axis motor 37. A nut portion 38 is threadedly engaged with the feed screw 36, and is fixedly secured to the support block 30. With this construction, by driving the Z-axis motor 37, the suction head C can be moved upward and downward, and by driving the Y-axis motor 33, the suction head C can be moved right and left (FIG. 1).

The operation of the solder ball-transferring apparatus of this embodiment will now be described with reference to FIGS. 2 to 4. First, the Y-axis motor 33 is driven to move the suction head C into a position above the ball reservoir B (FIG. 1). Then, the Z-axis motor 37 is driven to move the suction head C downward into the ball casing 18, so that the lower surface of the suction pad 28 slightly sinks into the layers of solder balls 19 as indicated in dot-and-dash lines in FIG. 2, and then the Z-axis motor 37 is rotated in a reverse direction to move the suction head C upward, so that the solder balls 19 are held by the suction holes 28a in the suction pad 28 under suction.

In this case, extra solder balls 19 (designated at $\underline{b}$ in FIG. 2) are often held in the vicinity of the suction holes 28a in the suction pad 28, and also extra solder balls 19 (designated at $\underline{c}$ in FIG. 2) are often held against the lower surface of the suction pad 28. Therefore, when the solder balls 19 are held on the suction pad 28 by suction, the vibrator element 29 is operated to vibrate the suction pad 28 as shown in FIG. 3. As a result, only those solder balls 19 firmly held directly and respectively by the suction holes 28a under suction remain held on the suction pad 28 whereas the other solder balls 19 on the lower surface of the suction pad 28 drop into the ball reservoir B since the suction force holding these extra solder balls 19 is weak.

When the suction pad 28 is to sink into the above-noted position indicated by the dot-and-dash lines in FIG. 2, the valve 21 is opened to blow the gas into the ball casing 18 to float and fluidize the solder balls 19. By doing so, the solder balls 19 within the ball casing 18 are rendered into a loose condition, and a predetermined number of solder balls 19 can surely be held respectively by the suction holes 28a under suction. During the time when the suction pad 28 is moved upward from the lower position (indicated by the dot-and-dash lines in FIG. 2) to pick up the solder balls 19, the Y-axis motor 33 is driven in its normal and reverse directions to reciprocally move the suction head 28 slightly (on the order of several millimeters) in a horizontal direction (i.e., lateral direction). As a result, the extra solder balls 19 (designated at $\underline{b}$ and $\underline{c}$), sticking to the suction pad 28 with a weak force at those areas other than the suction holes 28a, come off from the suction pad 28 (see FIG. 3), and only those solder balls 19 (designated at $\underline{a}$) firmly held directly respectively by the suction holes 28a under suction are continued to be picked up to the last.

By thus providing the gas supply means E for floating and fluidizing the solder balls 19 in the ball casing 18, as well as the laterally-moving means D for moving the suction pad C in the lateral direction relative to the ball casing 18, extra solder balls 19 are more effectively prevented from sticking to the lower surface of the suction head C, thus preventing the pick-up of such unnecessary solder balls 19. In this embodiment, although the feed screw 32, the Y-axis motor 33 and so on, which jointly constitute the moving means D for reciprocally moving the suction head C between the ball reservoir B and the positioning table A, also serve as the constituent elements of the laterally-moving means D, the laterally-moving means may be of any construction in so far as it can move the suction head C laterally relative to the ball reservoir B, and for example, there can be used means for moving the ball reservoir B laterally relative to the suction head C.

Then, the suction head C, having picked up the solder balls 19, is moved to the position above the workpiece 17 as shown in FIG. 4. Then, the suction head C moves downward to bring the solder balls 19, held on the lower surface thereof, onto respective electrodes 17a on the workpiece 17, and the solder balls 19 are released from the suction, and then the suction pad C moves upward, thus transferring the solder balls 19 onto the respective electrodes 17a. At this time, one or more solder balls 19 may fail to be transferred onto the electrodes 17a, and hence remain held on the lower surface of the suction pad 28, as shown in phantom in FIG. 4. Therefore, when the suction head C is moving upward in a direction of arrow N1 after the transferring operation is completed, the vibrator element 29 is operated to vibrate the suction pad 28. By doing so, the solder balls 19 are positively caused to drop from the lower surface of the suction pad 28 onto the electrodes 17a. The vibration-isolating rubber member 27 is interposed between the head body 26 and the suction pad 28, and therefore even when the suction pad 28 is vibrated by the vibrator element 29, the vibration-isolating rubber member 27 prevents the head body 26 from being vibrated, thereby preventing the accuracy of the operation of the moving means D from being lowered.

The present invention is not to be limited to the above embodiment, and the above embodiment can be modified in various ways. For example, in the above embodiment, when the suction head C is lowered into the ball casing 18 so as to hold the solder balls 19 by suction, the vibrator element 29 is operated, and further the suction head C is reciprocally moved laterally so that extra solder balls 19 will not stick to the lower surface of the suction head C; however, it is not always necessary to use both of the vibration and the reciprocal movement of the suction head C. Namely, the sticking of such extra solder balls may be prevented either by imparting vibrations to the suction pad C by the vibrator element 29 or by applying the reciprocal movement to the suction pad C.

Although the above embodiment is directed to the apparatus for transferring the solder balls, the invention can be applied to apparatus for transferring balls of any other conductive material such as gold, copper, aluminum and an alloy thereof.

As described above, in the present invention, when the suction head holds the solder balls in the ball reservoir, and is picking up these solder balls, extra solder balls are prevented from sticking to the lower surface of the suction head, and hence is prevented from being picked up, and therefore the suction head can pick up the solder balls, with each suction hole positively holding one solder ball by suction. And besides, when the solder balls are to be transferred from the suction head onto the workpiece, the solder balls are positively caused to drop from the lower surface of the suction head onto the workpiece.

What is claimed is:

1. A method of transferring conductive balls, comprising the steps of:
    (a) moving a suction head downward into a ball reservoir so as to cause a plurality of suction holes in a lower surface of said suction head to respectively hold conductive balls in said ball reservoir by suction applied to said suction holes, and thereafter moving said suction head upward from said ball reservoir, thus picking up said conductive balls;
    (b) then relatively moving said suction head into a position above a workpiece, then moving said suction head up and down while releasing said suction applied to said suction holes, thereby transferring said conductive balls from said suction head onto said workpiece; and
    (c) imparting vibration to said suction head when said suction head is moved upwardly and picks up said conductive balls while said suction is being applied to said suction holes in step (a) to remove any conductive balls sticking to the lower surface of said suction head except those held by said suction holes.

2. A method according to claim 1, in which when said suction head is moving upward from said ball reservoir, said suction head is moved laterally relative to said ball reservoir.

3. A method according to claim 1 or 2, in which when said suction head is going to pick up said conductive balls, gas is supplied into said ball reservoir to fluidize said conductive balls within said ball reservoir.

4. A method according to claim 2, in which when said suction head is going to pick up said conductive balls, gas is supplied into said ball reservoir to fluidize said conductive balls within said ball reservoir.

5. A method according to claim 1, further comprising arranging the conductive balls in layers in the ball reservoir, each layer having a plurality of conductive balls arranged generally in a matrix pattern, and forming said suction holes in a matrix pattern corresponding to said matrix pattern of said conductive balls, whereby said conductive balls of a given layer are in one-to-one alignment with said suction holes of said suction head.

6. A method according to claim 1, further comprising forming said suction head so as to include a main body and a suction pad attached to said main body, said suction pad including said lower surface comprising said suction holes, and imparting vibrations to the suction pad while mechanically isolating the main body from the vibrations.

7. A method of transferring conductive balls, comprising the steps of:
    (a) moving a suction head downward into a ball reservoir so as to cause a plurality of suction holes in a lower surface of said suction head to respectively hold conductive balls in said ball reservoir by suction applied to said suction holes, and thereafter moving said suction head upward from said ball reservoir, thus picking up said conductive balls;
    (b) then relatively moving said suction head into a position above a workpiece, then moving said suction head up and down while releasing said suction applied to said suction holes, thereby transferring said conductive balls from said suction head onto said workpiece; and
    (c) imparting vibration in step (b) when said suction head is moved upward while said suction applied to said suction holes is released during transfer of said conductive balls held respectively by said suction holes under suction from said suction holes to said workpiece to completely separate said conductive balls from said suction holes to transfer them onto said workpiece.

8. A method according to claim 7, further comprising arranging the conductive balls in layers in the ball reservoir, each layer having a plurality of conductive balls arranged generally in a matrix pattern, and forming said suction holes in a matrix pattern corresponding to said matrix pattern of said conductive balls, whereby said conductive balls of a given layer are in one-to-one alignment with said suction holes of said suction head.

9. A method according to claim 7, further comprising forming said suction head so as to include a main body and a suction pad attached to said main body, said suction pad including said lower surface comprising said suction holes, and imparting vibrations to the suction pad while mechanically isolating the main body from the vibrations.

10. A method of transferring conductive balls, comprising the steps of:
    (a) moving a suction head, including a lower surface having suction holes formed therein, into a ball reservoir in which a number of conductive balls are stored;
    (b) horizontally reciprocating said suction head relative to said ball reservoir in a condition in which said suction head is held in said ball reservoir after being moved downward while said conductive balls are respectively sucked to said suction holes by suction;

(c) moving said suction head upward from said ball reservoir to pick up said conductive balls; and (d) moving said suction head into a position above a workpiece and releasing the suction applied to said suction holes so as to transfer said conductive balls sucked to said suction holes onto said workpiece.

11. A method according to claim 10, further comprising arranging the conductive balls in layers in the ball reservoir, each layer having a plurality of conductive balls arranged generally in a matrix pattern, and forming said suction holes in a matrix pattern corresponding to said matrix pattern of said conductive balls, whereby said conductive balls of a given layer are in one-to-one alignment with said suction holes of said suction head.

12. A method according to claim 10, further comprising forming said suction head so as to include a main body and a suction pad attached to said main body, said suction pad including said lower surface comprising said suction holes, and imparting vibrations to the suction pad while mechanically isolating the main body from the vibrations.

* * * * *